US 11,601,124 B2

(12) United States Patent
Handt et al.

(10) Patent No.: US 11,601,124 B2
(45) Date of Patent: Mar. 7, 2023

(54) DC SWITCH

(71) Applicant: Siemens Aktiengesellschaft, Munich (DE)

(72) Inventors: Karsten Handt, Berg (DE); Stefan Hänsel, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/545,953

(22) Filed: Dec. 8, 2021

(65) Prior Publication Data

US 2022/0182051 A1  Jun. 9, 2022

(30) Foreign Application Priority Data

Dec. 9, 2020  (EP) .................................... 20212658

(51) Int. Cl.
*H03K 17/56* (2006.01)
(52) U.S. Cl.
CPC ................................... *H03K 17/56* (2013.01)
(58) Field of Classification Search
CPC ....... H03K 17/04106; H03K 17/04163; H03K 17/04206; H03K 17/063; H03K 17/08104; H03K 17/08122; H03K 17/08142; H03K 17/0822; H03K 17/102; H03K 17/122; H03K 17/13; H03K 17/133; H03K 17/145; H03K 17/161; H03K 17/162; H03K 17/163; H03K 17/165; H03K 17/164; H03K 17/166; H03K 17/167; H03K 17/223; H03K 17/284; H03K 17/687; H03K 17/6871; H03K 17/6872; H03K 17/6874;
(Continued)

(56) References Cited

U.S. PATENT DOCUMENTS

| 11,356,183 B2 * | 6/2022 | Golan ................... H01S 5/0683 |
| 2013/0043538 A1 * | 2/2013 | Lu .......................... H01L 27/088 |
| | | 257/E27.062 |

(Continued)

FOREIGN PATENT DOCUMENTS

| CN | 106 896 275 | 6/2017 | ............. G01R 27/26 |
| DE | 102014012828 A1 * | 3/2016 | ............. H02H 9/001 |

(Continued)

OTHER PUBLICATIONS

Search Report for EP Application No. 20212658.7, 6 pages, dated May 20, 2021.

*Primary Examiner* — Quan Tra
(74) *Attorney, Agent, or Firm* — Slayden Grubert Beard PLLC

(57) ABSTRACT

Various embodiments include a DC switch for disconnecting a DC line. The switch may include: a power semiconductor switch arranged in a current path of the DC line; a first sensor for measuring the input and output voltages; a second sensor for measuring the current flowing through the DC line; and a controller for the power semiconductor switch. The control device is configured to: switch on the DC switch for a first time period; determine the input voltage present; determine the output voltage present at the end of the first time period; determine the current intensity present at the end of the first time period; and determine an inductance and/or capacitance from the determined values.

14 Claims, 2 Drawing Sheets

(58) Field of Classification Search
CPC ............ H03K 17/6877; H03K 17/689; H03K 17/6895; H03K 17/691; H03K 17/693; H03K 2017/6875; H03K 2017/6878
USPC ................................................ 327/427–434
See application file for complete search history.

(56) References Cited

U.S. PATENT DOCUMENTS

| | | | |
|---|---|---|---|
| 2020/0124657 A1 | 4/2020 | Tanahashi | ............... G01R 31/12 |
| 2021/0036698 A1* | 2/2021 | Nakano | .............. H03K 17/0824 |
| 2021/0257832 A1* | 8/2021 | Du | ......................... H02H 9/025 |
| 2021/0288638 A1* | 9/2021 | Filoramo | ........... H03K 17/0822 |

FOREIGN PATENT DOCUMENTS

| | | | | |
|---|---|---|---|---|
| EP | 1 643 256 | 4/2006 | ............. | G01R 27/16 |
| JP | 2002 090402 | 3/2002 | ............. | G01R 27/26 |
| WO | 2017 000996 | 1/2017 | ............. | G01R 27/26 |

* cited by examiner

DC SWITCH

CROSS-REFERENCE TO RELATED APPLICATIONS

This application claims priority to EP Application No. 20212658.7 filed Dec. 9, 2020, the contents of which are hereby incorporated by reference in their entirety.

TECHNICAL FIELD

The present disclosure relates to DC circuits. Various embodiments of the teachings herein include a DC switch for disconnecting a DC line, comprising at least one semiconductor switch arranged in the current path of the DC line and a control device for the semiconductor switch.

BACKGROUND

Owing to their ability to switch off DC currents rapidly and without an arc arising, it is technically expedient to use semiconductor switches as switches for DC networks. In this case, the semiconductor switch is typically arranged directly in the current path. In the switched-on state, the semiconductor switch therefore accepts the full load current and is permanently switched on during normal operation. If a fault occurs in the network to be protected, the semiconductor switch must be able to switch off said fault.

Two types of load are problematic here, namely capacitive loads with particularly small or particularly large supply line inductances. In DC networks with capacitive loads without relatively large supply line inductances, very high rates of current rise result. If the latter are so high that, for a given switch-off delay of the switch (caused by dead times during the current measurement, switch-off time delay, etc.), the maximum controllable current of the semiconductor switch is exceeded, said semiconductor switch can no longer switch off the fault. The DC switch is destroyed as a consequence. DC switches therefore provide a minimum supply line inductance, which is specified in the data sheet.

DC networks with very large supply line inductances constitute the other extreme. Here the limiting element is not the switch-off delay of the switch, but rather the energy stored in the supply line inductance. For dissipating this energy, DC switches usually have a protective network for overvoltage limiting, here also referred to as a load relieving network. In this case, the energy stored in the supply line inductance is converted, for example into heat (when varistors are used), or stored (for example in capacitors). Since the loading capacity of the load relieving network is limited, usually a maximum supply line inductance is also provided for DC switches.

In real installations, it is often unclear what supply line inductance is installed. As a result, it is also unclear what loading should be expected during switching processes for a switch. The loading can only be established by means of complex measurements on site or by means of short-circuit tests according to the trial and error principle.

SUMMARY

Teachings of the present disclosure include DC switches in which the disadvantages mentioned in the introduction are reduced. In particular, the DC switch is intended to ensure that it can switch off nondestructively. For example, some embodiments of the teachings herein include a DC switch (20) for disconnecting a DC line (18), comprising: at least one power semiconductor switch (21, 22) arranged in the current path of the DC line (18), means (28, 29) for measuring the input and output voltages (32, 33), means (30) for measuring the current (31) flowing through the DC line (18), and a control device (25) for the power semiconductor switch (21, 22), wherein the control device (25) is configured: to switch on the DC switch (20) for a first time period, to determine the input voltage (32) present, to determine the output voltage (33) present at the end of the first time period, to determine the current intensity (31) present at the end of the first time period, and to determine an inductance and/or capacitance present from the determined values.

In some embodiments, the control device (25) is configured to use a duration defined prior to switch-on as the first time period.

In some embodiments, the control device (25) is configured to shorten the first time period and to switch off the DC switch (20) if the current intensity (31) reaches a current threshold value.

In some embodiments, the control device (25) is configured to calculate the inductance present in accordance with the formula $$L_{supply\ line} = \frac{U \cdot t_{pulse}}{I_{peak}}$$

wherein $L_{supply\ line}$ is the inductance, U is a driving voltage determined from input voltage and/or output voltage, $t_{pulse}$ is the first time period, and $I_{peak}$ is the current intensity present at the end of the first time period.

In some embodiments, the control device (25) is configured to determine whether a supply voltage (32) is present.

In some embodiments, the control device (25) is configured to determine the output voltage (33) present at the beginning of the first time period.

In some embodiments, the control device (25) is configured to carry out a determination of the inductance and/or capacitance present before each switch-on process.

In some embodiments, the control device (25) is configured to compare the determined current intensity (31) with a threshold value and, on the basis of the result of the comparison, to determine once again the inductance present, wherein a second time period is used instead of the first time period, said second time period being longer than the first time period.

In some embodiments, the control device (25) is configured to compare the determined inductance present with a maximum permitted inductance and a minimum permitted inductance and to output a signal indicating whether the determined inductance lies between the permitted inductances.

In some embodiments, the control device (25) is configured to repeatedly carry out the determination of the inductance present and to ascertain an averaged inductance.

In some embodiments, the control device (25) is configured to ascertain a duration for the current intensity (31) to fall to zero after the switching into the disconnected state and to take into account when ascertaining the capacitance present on the load side.

In some embodiments, the control device (25) is configured to calculate the capacitance present on the load side in accordance with the formula $$C_{load} = \frac{(Q_{load1} + Q_{load2})}{\Delta U_{out}}$$

wherein $C_{load}$ is the capacitance, $Q_{load1}$ is a quantity of charge input on the load side in the connected state, $Q_{load2}$ is a quantity of charge input on the load side after the switching into the disconnected state, and $\Delta U_{out}$ is the change in the output voltage that arises as a result of the input quantities of charge.

In some embodiments, the control device (25) is configured to calculate the input quantities of charge in accordance with the formulae $$Q_{load1} = \frac{i_{peak} \cdot (t_{toff} - t_0)}{2}$$

$$Q_{load2} = \frac{i_{peak} \cdot (t_1 - t_{off})}{2}$$

wherein $t_0$ is a switch-on instant (34), $t_{off}$ is a switch-off instant (35) and $t_1$ is an instant at which the current intensity reaches zero again after switch-off.

In some embodiments, the control device (25) is configured to determine the input quantities of charge by numerical integration of the current intensity (31).

In some embodiments, the control device (25) is configured to compare the determined capacitance present on the load side with a maximum permitted capacitance and to output a signal indicating whether the determined capacitance is greater than the maximum permitted capacitance.

BRIEF DESCRIPTION OF THE DRAWINGS

The teachings herein are explained and described in greater detail below in association with an exemplary embodiment with reference to the figures of the drawing, in which.

DETAILED DESCRIPTION

Figure 1:
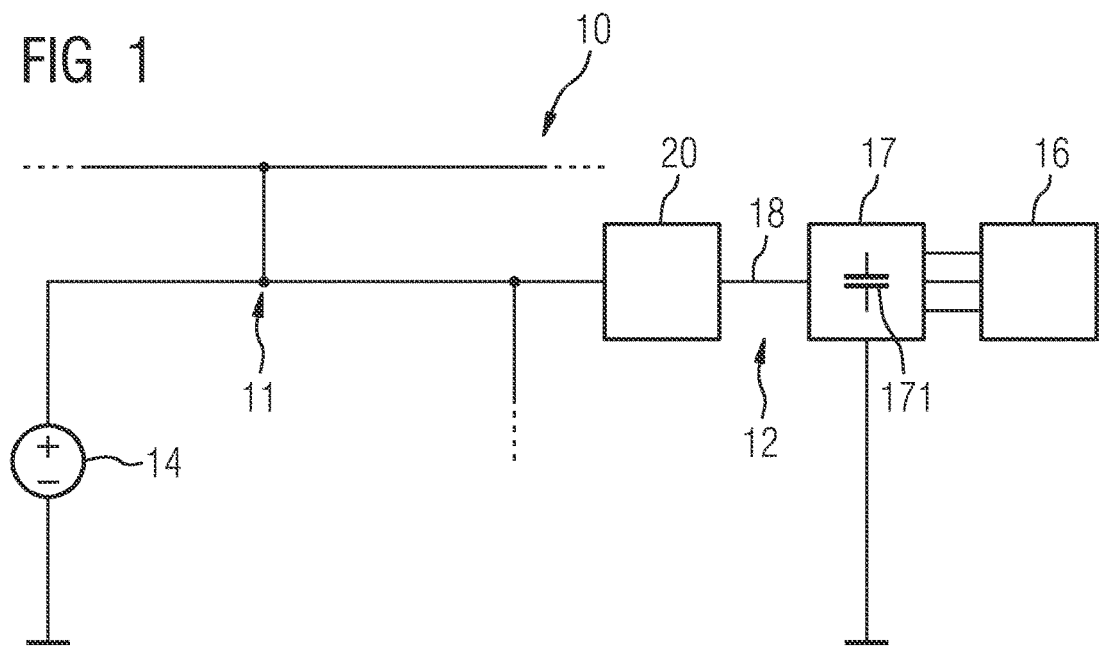
FIG. 1 shows a DC network having a supply-side part and a load-side part, wherein the parts are connected by a DC switch incorporating teachings of the present disclosure.

The teachings of the present disclosure may be incorporated in a DC switch for disconnecting a DC line in a controllable manner comprises at least one power semiconductor switch arranged in the current path of the DC line, means for measuring the input and output voltages, means for measuring the current flowing through the DC line, and a control device for the power semiconductor switch. The control device is configured to switch on the DC switch for a first time period, to determine an input voltage present on the supply side, to determine the load-side output voltage present at the end of the first time period, to determine the current intensity present at the end of the first time period, and to determine an inductance and/or capacitance present from the determined values.

In some embodiments, switching on the DC switch denotes switching from an off state into an on state of the DC switch. For this purpose, the power semiconductor switch is switched on, i.e. for its part is switched into the on state. One of the connections of the DC switch is designated as supply-side. This is taken to mean the side to which a voltage supply is connected, that is to say on which the voltage level present is influenced by the switching state of the DC switch only to a small extent in the normal case. The other side is designated as load-side and means the side to which a consumer such as, for example, an electric motor fed via a converter is connected. In this case, the load-side voltage level may depend directly on the switching state of the DC switch and fall to zero when the DC switch is switched off.

The differentiation into load-side and supply-side serves for elucidation. The installation situation may be more complex in real DC networks. By way of example, a plurality of consumers and/or power generators may be connected on the load side. A whole network of other DC switches, loads and power generators may be present on the supply side. The installation situation may thus even be symmetrical, as a result of which a differentiation into supply-side and load-side is no longer possible. The two terms then denote the two connection sides of the DC switch and are interchangeable.

In some embodiments, a suitable control sequence for the DC switch comprising a short switch-on of the DC switch allows measurement values to be recorded which allow an inductance present on the load side to be ascertained. For this purpose, the necessary driving capability for the short switch-on and the necessary measuring devices, namely a voltage measuring device for the load-side voltage and a current measuring device for the current flow through the DC switch, are typically present anyway in the case of such switches. Therefore, in the case of correspondingly equipped DC switches, the measurement can even be performed without structural modification. If the effective, i.e. load-side and consumer-side, inductance present is known to the control device as a result of the measurement, the DC switch can be controlled to deal with the value of the inductance and to avoid destruction.

In some embodiments, the power semiconductor switch may be an IGBT. However, some other type of power semiconductor switch can also be used.

In some embodiments, the DC switch can comprise two power semiconductor switches connected in antiseries. As a result, the DC switch is bidirectional, that is to say suitable for switching off a current flow independently of the current flow direction. By contrast, if the DC switch comprises only one power semiconductor switch, usually only a current flow in one direction can be switched off.

In some embodiments, the control device can be configured to use a duration defined prior to switch-on as the first time period. That is to say, in other words, that the DC switch is switched on at a switch-on instant and is switched off again at a switch-off instant fixed beforehand. The development of current and voltage is unimportant for the duration of the switch-on in this case.

In some embodiments, the control device can also be configured to shorten the first time period if the current intensity reaches a current threshold value. That is to say, in other words, that the DC switch is switched on at a switch-on instant and is switched off again at a switch-off instant not fixed beforehand. In this case, the switch-off instant results from the profile of the current flowing through the DC switch. A measurement of the inductance present becomes more accurate as a result since the current cannot be arbitrarily small at the switch-off instant. The current threshold value may be chosen to be large enough that the measurement inaccuracies present do not dominate.

However, a prerequisite for functioning in an appropriate time frame is that the inductance present is not too large since otherwise the first time period can become very large. Therefore, it may be furthermore expedient to use for the first time period a maximum duration that the first time period does not exceed even if the current intensity does not reach the current threshold value. In this case, therefore, both a switched-on duration defined beforehand is used and a switch-off is carried out upon the current threshold value being reached. The maximum duration may be less than 1 ms, in particular less than 10 μs.

The control device can be configured to calculate the inductance present in accordance with the following formula:

$$L_{supply\,line} = \frac{U \cdot t_{pulse}}{I_{peak}}$$

In this case:

$L_{supply\,line}$ denotes the inductance;
U denotes a driving voltage;
$t_{pulse}$ denotes the first time period; and
$I_{peak}$ denotes the current intensity present at the end of the first time period.

In this case, the driving voltage is, to a first approximation, the voltage present on the supply side. In some embodiments, the control device can be configured also to determine the voltage present on the load side (also referred to herein as output voltage) and, for the purpose of increasing the accuracy, to subtract said voltage from the voltage present on the supply side for the purpose of determining the driving voltage.

In some embodiments, the control device can be configured to determine whether a supply voltage is present and otherwise not to perform a measurement. If no supply voltage is present, the inductance cannot be determined and all results and conclusions drawn for a measurement may be invalid.

In some embodiments, the control device can be configured to determine the output voltage present at the beginning of the first time period. The measurement accuracy can be increased as a result since the voltage present on the load side can change significantly during the switched-on duration. The output voltage can then be averaged.

In some embodiments, the control device can be configured to compare the determined inductance present with a maximum permitted inductance and a minimum permitted inductance and to output a signal indicating whether the determined inductance lies between the permitted inductances. As a result, it becomes evident directly at the device whether the installation situation is okay, that is to say whether the DC switch is suitable for a switch-off. As a result, installation situations in which a switch-off leads to destruction of the DC switch become evident immediately and can be corrected.

In some embodiments, the control device can be configured to compare the determined current intensity at the switch-off instant, that is to say after the first time period has elapsed, with a threshold value and, on the basis of the result of the comparison, to determine once again the inductance present, wherein a second time period is used instead of the first time period, said second time period being longer than the first time period. This makes it possible to ensure that a sufficient measurement accuracy is present since the inductance is ascertained using a sufficiently large current value rather than an excessively small current value attained from the first time period. If the current value attained in the second time period is also too low, it is possible to continue with further, larger time periods.

In some embodiments, the control device can be configured to carry out a determination of the effective inductance and/or load-side capacitance before each switch-on process. What is achieved as a result is that the operational reliability continuously remains ensured even if changes in the installation situation or in the loads occur. In this case, it may be advantageous that the time periods used for the measurement are in the μs to ms range and, consequently, even a plurality of measurements delay the switch-on only insignificantly.

In order to further increase the measurement accuracy, the control device can be configured to repeatedly carry out the determination of the inductance present and to ascertain an averaged inductance. Noise components of the measurements are thereby reduced in the result.

In some embodiments, the control device can be configured to ascertain the capacitance effective on the load side. This may be advantageous since said capacitance has to be precharged before the DC switch is turned on. The switch is usually designed for a maximum permissible capacitance. For this purpose, the control device carries out a test already before the actual precharge to establish whether the capacitance effective on the load side exceeds the design limit.

Both during the switch-on process for ascertaining the inductance and for ascertaining the capacitance, a precharge resistor present in the DC switch can be turned on. In this case, a further switch arranged in series with the precharge resistor is switched on, rather than the power semiconductor switch(es) arranged in the main current path. Since the precharge resistor has a current limiting effect, in this case the switched-on duration can be chosen to be longer than in the case of a switch-on process using the power semiconductor switches in the main current path.

In some embodiments, the switch-on process can indeed also be performed with the power semiconductor switches in the main current path. The control device can be configured to calculate the capacitance present on the load side in accordance with the formula:

$$C_{load} = \frac{Q_{load1} + Q_{load2}}{\Delta U_{out}}$$

In this case:

$C_{load}$ is the capacitance;
$Q_{load1}$ is a quantity of charge input on the load side in the connected state;
$Q_{load2}$ is a quantity of charge input on the load side after switching into the disconnected state; and
$\Delta U_{out}$ is the change in the output voltage that arises as a result of the input quantities of charge.

The input quantities of charge can be determined in accordance with the following formulae:

$$Q_{load1} = \frac{i_{peak} \cdot (t_{off} - t_0)}{2}$$

$$Q_{load2} = \frac{i_{peak} \cdot (t_1 - t_{off})}{2}$$

In this case:

$t_0$ is a switch-on instant;

$t_{off}$ is a switch-off instant; and $t_1$ is an instant at which the current intensity reaches zero again after the switch-off.

In some embodiments, the time after the switch-off during which the current flow has not yet fallen to 0 A again is also taken into account for ascertaining the capacitance. In this case, the control device can be configured to determine the input quantities of charge by numerical integration of the current intensity.

In some embodiments, the control device can be configured to compare the determined capacitance present on the load side with a maximum permitted capacitance and to output a signal indicating whether the determined capacitance is greater than the maximum permitted capacitance. This ensures that it immediately becomes recognizable if the capacitance connected on the load side exceeds the precharge capability of the DC switch.

FIG. 1 shows a DC network 10. The DC network 10 is divided into a supply-side part 11 and a load-side part 12 by a DC switch 20. In the present example, the supply-side part 11 comprises a DC voltage source 14, which provides an exemplary voltage of 650 V. This voltage is present at the DC switch 20 on the input side. The load-side part 12 comprises a load in the form of an electric motor 16, an inverter 17 being connected upstream thereof. The inverter 17 in turn comprises a DC voltage link circuit having a capacitor 171 and half-bridges connected in parallel with the capacitor 171, by means of which half-bridges a three-phase operating voltage for the electric motor 16 is generated from the DC voltage present.

The load composed of inverter 17 and electric motor 16 is manifested as a capacitive load for the DC switch 20 by virtue of the capacitor 171 constituting the DC voltage link circuit. The supply line 18 between the DC switch 20 and the inverter 17 in turn has an inductance. As described in the introduction, the inductance of the supply line 18 typically has to be in a previously known range between a minimum and a maximum inductances, for example between 4 pH and 80 pH, in order to ensure a reliable switch-off by the DC switch 20. The capacitance of the capacitor 171 must also not exceed a maximum capacitance value, for example 40 mF, since otherwise the DC switch 20 cannot reliably perform the precharge of the capacitor 171.

Figure 2:
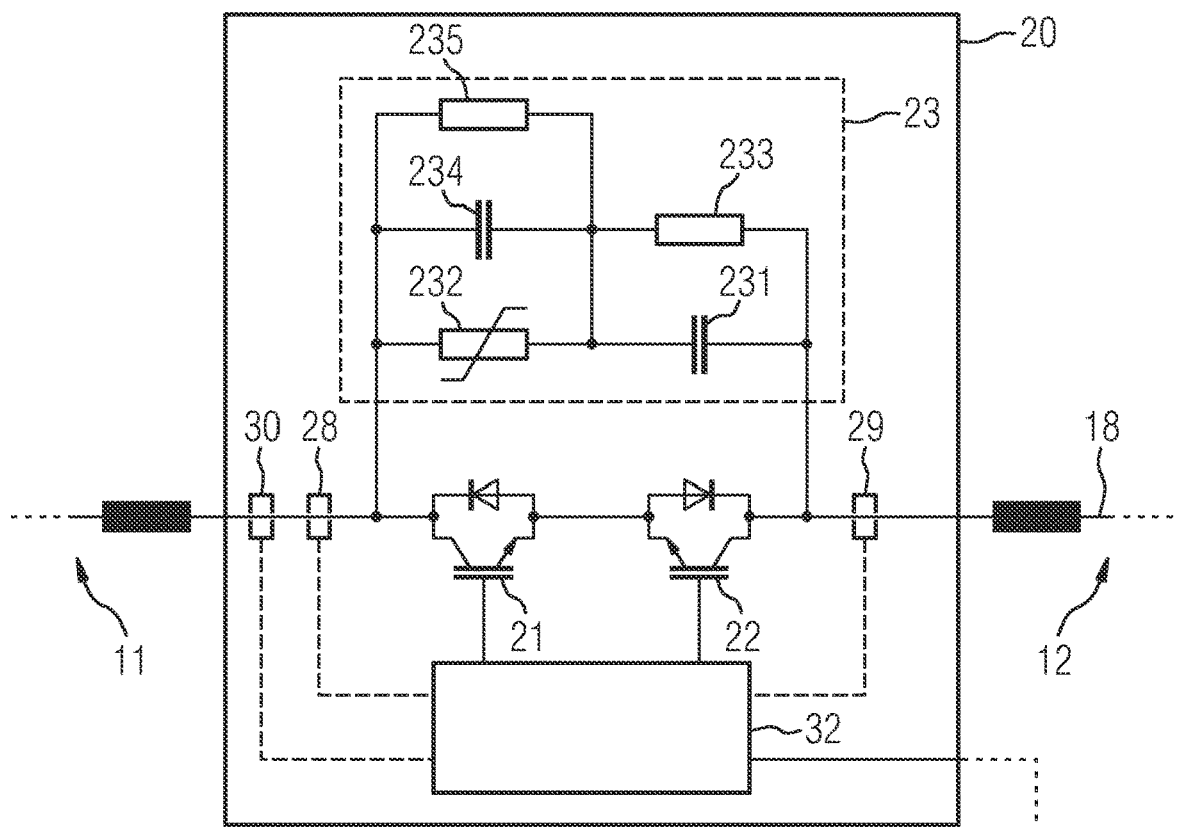
FIG. 2 shows the DC switch with power semiconductor switches.

FIG. 2 shows a DC switch 20, which is one exemplary embodiment of the teachings herein in more specific detail. The DC switch 20 comprises two antiseries-connected power semiconductor switches 21, 22, for example IGBTs, with their freewheeling diodes, which are usually already installed in the module. The power semiconductor switches 21, 22 are linked in series into the current path of the DC voltage network 10. They thus carry the entire load current in the switched-on state of the DC switch 20 and directly bring about the switch-off of the current flow and the blocking of the supply voltage present. The DC switch 20 can switch off current in both directions with the two power semiconductor switches 21, 22. In some embodiments, a DC switch 20 can also have just a single power semiconductor switch, as a result of which, however, the switch-off capability is restricted to one current direction.

The DC switch 20 comprises a load relieving network 23 in parallel with the power semiconductor switches 21, 22. The exemplary load relieving network 23 is connected in parallel with the two power semiconductor switches 21, 22. It comprises a first series circuit formed by a capacitor 231 and a varistor 225. A second series circuit having a resistor 233 and a second capacitor 234 is connected in parallel with the first series circuit. A second resistor 235 is connected in parallel with the second capacitor 234. The center point of the first and second series circuits is connected.

In some embodiments, the DC switch 20 has a precharge circuit, not illustrated in FIG. 2, which allows capacitances connected on the load side to be charged and in this case limits the flowing current by means of a resistor connected in series in order to avoid the erroneous detection of a short circuit and the following undesired switch-off.

On the input side, the DC switch 20 comprises a measuring device for measuring the input voltage, that is to say the supply voltage in the DC voltage network 10. The supply voltage is 650 V in this example. On the output side, the DC switch 20 comprises a measuring device 29 for measuring the output voltage. In this exemplary embodiment, the measuring devices 28, 29 are constructed as voltage dividers with a sigma-delta converter. In the switched-off state and for a sufficiently long time after the last switch-off, said voltage is generally 0 V, while for a sufficiently long time after a switch-on, that is to say during ongoing operation of the load, said voltage corresponds almost to the input voltage, the difference with respect to the input voltage being the voltage drop across the two conducting power semiconductor switches 21, 22. The DC switch 20 furthermore comprises a measuring device 30 for determining the present current flow through the DC switch 20. The measuring device 30 is embodied as a magnetoresistive current sensor, for example.

The measuring devices 28 . . . 30 are connected to a control device 25, which records and processes the signals determined. The control device 25 furthermore also controls the power semiconductor switches 21, 22 by way of signals at the respective gate terminal thereof. For this purpose, the control device 25 is connected to a superordinate controller and switches the power semiconductor switches 21, 22 on, that is to say conducting, and off in response to the signals of said controller. In this text, the DC switch 20 is designated as switched off if the two power semiconductor switches 21, 22 are switched off, that is to say switched to be nonconducting. The DC switch 20 is designated as switched on if the two power semiconductor switches 21, 22 are switched on, that is to say conducting. Furthermore, the control device 25 is also configured to perform a switch-off automatically under certain circumstances. That may be necessary for example if a load-side short circuit is ascertained.

Often in real DC networks 10, the values for the capacitance of a load, that is to say here the capacitance of the capacitor 171, and the length and inductance of the supply line 18 are unknown. If the inductance of the supply line 18 exceeds a specific value known for the DC switch 20, the load relieving network 23 can no longer sufficiently limit the overvoltage that occurs after a switch-off. Therefore, destruction of the power semiconductor switches 21, 22, can no longer be ruled out. Furthermore, the DC switch 20 is designed only for the precharge of a maximum load capacitance, which must therefore likewise be complied with. If the values for inductance and capacitance are unknown, the operational reliability can only be ensured by means of additional outlay, for example by means of estimation or manual measurement of the required values. In order to combat this problem, the control device 25 is furthermore configured to carry out a test process in response to a trigger, for example a button being pressed on the device or an electronically communicated signal, for example from a tablet PC.

The test process presupposes that the DC switch 20 is switched off and a supply voltage is present on the input side. If that is the case, the control device 25 switches the DC switch 20 on at a switch-on instant for a first time period and switches it off again at a switch-off instant after the first time period has elapsed. In this case the first time period is chosen to be very short, for example 4 µs.

The current intensity of the current flowing through the DC switch 20 and also the output voltage are determined at least at the switch-off instant. In addition, it is also possible to determine and record the profile of the current between the switch-on instant and the switch-off instant. Likewise, it is additionally possible to determine the output voltage at the switch-on instant.

Figure 3:
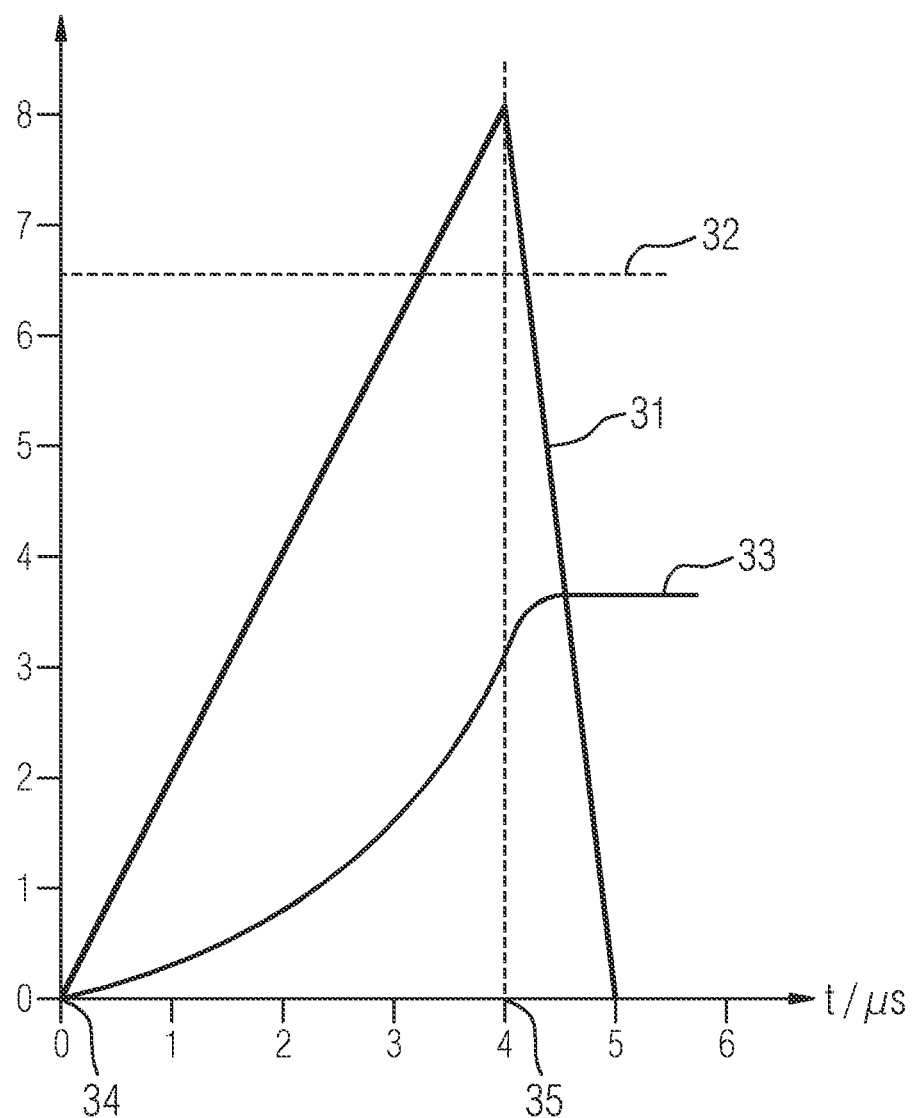
FIG. 3 shows a diagram indicating a measurement cycle carried out by the DC switch.

FIG. 3 shows an exemplary profile of the current intensity 31 in A, of the supply voltage 32 and of the output voltage 33 for such a test process. The DC switch 20 is switched on at the switch-on instant 34, which here is put at the time t=0 for the sake of simplicity, and is switched off again at the switch-off instant 35. The supply voltage 32 is uniform on a relatively long-term basis and will be constant over the short period of time illustrated. The current intensity, as a result of the inductance, does not increase directly to the maximum value, but rather rises instead. This rise is generally nonlinear. However, since the current reaches only a small fraction of its maximum value in the short first time period, the rise is practically linear during this time. After the switch-off instant, the current falls to zero again—likewise with a finite rate of change of current. The output voltage likewise rises linearly during this time, the value reached at the switch-off instant being small compared with the input voltage.

From the generally known relationship between the voltage U, the inductance L, the current i and time t $$U = L \frac{di}{dt}$$

the inductance $L_{supply\ line}$ of the supply line 18 that is present can be determined using the variables determined in the test process. To that end, the formula is rearranged to $$L_{supply\ line} = \frac{U \cdot t_{pulse}}{I_{peak}}$$

In this case, $t_{pulse}$ denotes the switched-on duration, that is to say the first time period. $I_{peak}$ is the current intensity present at the switch-off instant, and U is the driving voltage. In a simplified variant, the magnitude of the supply voltage 32 can be used as driving voltage. This simplification constitutes only a small error as long as the output voltage that arises during the first time period remains small compared with the input voltage. In this case, it is possible to ascertain the inductance with knowledge of the input voltage, the current intensity at the switch-off instant and the length of the first time period.

A more accurate ascertainment can be effected by ascertaining the driving voltage in accordance with the following method:

$$U = U_{in} - \left( U_{out_0} + \frac{U_{out_1} - U_{out_0}}{2} \right) = U_{in} - \frac{U_{out_0} + U_{out_1}}{2}$$

In this case, $U_{in}$ is the supply voltage, $U_{out_0}$ is the output voltage present at the switch-on instant, and $U_{out_1}$ is the output voltage present at the switch-off instant.

Assuming exemplary values, such as are evident in FIG. 3, of 650 V for the supply voltage, 4 µs for the first time period, 0 V for $U_{out_0}$ and 3 V for $U_{out_1}$, this results in $$L_{supply\ line} = \frac{(650\ V - 3\ V/2) \cdot 4\mu s}{8A} \approx 254 \mu H$$

for the inductance of the supply lines that is present.

The values that arise in the measurements for the current intensity and the output voltages depend on the supply voltage, the inductance and the chosen time duration. In the case of specific combinations of these values, for example in the case of a very high inductance or a time duration chosen to be very short, the measurement values are too small and therefore too inaccurate to reliably ascertain the inductance.

For these cases, the control device 25 is configured to compare the measured current intensity with a threshold value. If the current intensity falls below the threshold value, a renewed measurement is carried out, wherein a second time period is used as switched-on duration, that is to say as interval between switch-on instant and switch-off instant, said second time period being longer than the first time period. By way of example, a time duration of 6 µs can be used for the renewed measurement.

The control device 25 can be configured, in particular, to increase the switched-on duration used in steps of 2 µs, for example, until the measured current intensity exceeds the threshold value or until a maximum switched-on duration is reached. If the current intensity reached exceeds the threshold value, the measurement result can be used and the inductance of the supply lines can be ascertained. Since the individual measurement is very short, even a large number of measurements require a time of less than 1 ms. Therefore, instead of a first time period of 4 µs, it is also possible to use a first time period that is so short, for example 500 ns, that only a very low current intensity is reached in any case. Thus, even for unusual installation situations, it is ensured that the test process does not cause any damage and a current intensity that allows the inductance to be ascertained is then reached in subsequent longer measurements.

The result can be processed further, for example by the inductance determined being electronically communicated or output directly on a display. In some embodiments, it is also possible to carry out a comparison with values stored in the DC switch 20 for the maximum and minimum inductances for the supply lines 18. If the inductance determined lies between the minimum and maximum inductances, it is possible to output a signal corresponding to a positive report, for example by means of a green LED lighting up. Otherwise a warning signal can be output. Furthermore, the control device 25 can be configured, in the case of a negative result, to prevent a switch-on of the DC switch 20 for active operation.

If the maximum switched-on duration is reached, either the effective inductance is too large and operation is thus not possible or else the input voltage is too low. The inductance therefore cannot be ascertained or can only be ascertained too inaccurately and once again a warning signal can be output and the switch-on of the DC switch 20 can be prevented.

In order to bring about a further improved accuracy of the measurement, in some embodiments of the DC switch 20, the control device 25 can be configured to repeat the measurement without changing the settings, in particular the switched-on duration. The collected and stored results can then be averaged in order to reduce the influence of fluctuations in the measurement results.

Generally, the measuring devices for ascertaining input and output voltages and current intensity are designed in regard to the rated values of the DC switch 20 and therefore yield inaccurate results in the case of the comparatively low values reached in the context of the test processes.

Therefore, in the embodiment described here, the control device 25 is furthermore configured to carry out a second test process in the case where the inductance of the supply lines 18 is at least equal in magnitude to the minimum inductance. Since the inductance of the supply lines 18 is sufficiently large, a shortest possible switched-on duration for avoiding excessively large currents no longer has to be complied with so intensively. Therefore, during the second test process, importance can be attached to attaining a minimum current intensity in order to enable the inductance to be ascertained more accurately.

During the second test process, therefore, in contrast to the first test process, the current intensity is predefined, rather than the switched-on duration. This predefined current intensity can be chosen such that measurement inaccuracies are only of secondary significance. By means of the input and output voltages before the test, it is possible to calculate a current intensity which is to be expected in the case of the maximum inductance of the supply lines in a third time period. This value is stored as a reference value in a comparison unit, for example a comparator. Under certain circumstances, the reference value can be set more accurately than the current measurement itself is. The DC switch 20 is then switched on maximally for the third time period. If the current already reaches the calculated value before the third time period has elapsed, the DC switch 20 is immediately switched off and the switched-on duration that elapsed is stored. If the calculated value for the current intensity is not reached, the current value reached is used as the result.

Formula (2) as already introduced can be applied in both cases. If the current already reaches the calculated value before the third time period has elapsed, the switched-on duration that elapsed is used as the value for the time t. Otherwise the maximum current value determined is used. In other possible configurations of the DC switch 20, the control device 25 is configured to perform the second test process without previously carrying out the first test process.

The control device 25 is furthermore configured to carry out a check of the connected capacitance and a comparison with a stored maximum permissible precharge capacitance. The latter is likewise limited at least when a precharge resistor is used. The value of the maximum permissible precharge capacitance is stored for this in the control device 25.

For this purpose, the relationships $$Q = \int_{t0}^{t1} i\,dt$$

and $$C = \frac{Q}{U}$$

are used, wherein Q is the quantity of charge and C is the capacitance. Assuming that the supply voltage is significantly greater than the output voltage that arises during the switched-on duration, the profile of the current intensity, such as is illustrated in FIG. 3, can be divided into two ranges having an approximately linear profile in order to simplify the calculation of the integral. In this case, the first range is the switched-on duration itself, that is to say the first time period, for example. The second range extends from the switch-off instant to the instant at which the current intensity reaches 0 again. The impressed quantity of charge can then be calculated using the abovementioned formula as follows:

First range:

$$Q_{load1} = \frac{i_{peak} \cdot (t_{off} - t_0)}{2} = \frac{8A \cdot (4\mu s - 0)}{2} = 16\mu As$$

Second range:

$$Q_{load1} = \frac{i_{peak} \cdot (t_1 - t_{off})}{2} = \frac{8A \cdot (5\mu s - 4\mu s)}{2} = 4\mu As$$

The resulting total quantity of charge is the sum of the two portions, that is to say 20 µAs. In some embodiments, in an implementation in a microcontroller a numerical integration method can also be used to ascertain the introduced quantity of charge. The division into two ranges is then unnecessary.

The load capacitance can then be ascertained from the quantity of charge by means of formula (5):

$$C_{load} = \frac{Q_{load1} + Q_{load2}}{\Delta U_{out}} = \frac{20\mu As}{3V} = 6.7\mu F$$

By comparing the determined value for the connected capacitance with the maximum permissible precharge capacitance, the control device 25 determines whether it is permissible at all to switch on the precharge. For the positive and the negative cases, the control device 25 can once again be configured to electronically output a signal or display it directly visibly. Furthermore, the control device 25 can once again be configured to prevent a switch-on if the maximum permissible precharge capacitance is exceeded.

The DC switch 20 described thus ensures nondestructively that the installed supply line inductance is greater than the minimum permissible supply line inductance and less than the maximum permissible supply line inductance. Furthermore, it also ensures that the installed load capacitance is less than the maximum permissible precharge capacitance. Advantageously, no complex manual measurements or checks are necessary for this purpose.

Over and above pure feedback at the installation time, the DC switch 20 can prevent a switch-on during ongoing operation, too, if that would result in an unsafe operating state. For this purpose, it is also possible for the test processes described and the ascertainment of the values connected on the load side to be performed not only upon start-up but also during ongoing operation.

In some embodiments, the control device 25 can be configured to perform the ascertainment of the connected inductance and/or capacitance before each switch-on process demanded by a superordinate controller, for example. In this case, even when a plurality of test processes are carried out with different time periods, said ascertainment takes up only very little time, in particular less than 1 ms, and can therefore be carried out before the switch-on even during ongoing operation. If the permitted value ranges known to the DC switch 20 are not complied with, the switch-on process does not take place and the DC switch 20 outputs a fault message.

LIST OF REFERENCE SIGNS

10 DC voltage network
11 supply-side part
12 load-side part
14 voltage source
16 electric motor
17 inverter
18 supply line
20 DC switch
21, 22 power semiconductor switch
23 load relieving network
231, 234 capacitor
225 varistor
233, 235 resistor
28, 29, 30 measuring devices
25 control device
31 current intensity
32 supply voltage
33 output voltage
34 switch-on instant
35 switch-off instant

The invention claimed is:

1. A DC switch for disconnecting a DC line, the switch comprising:
a power semiconductor switch arranged in a current path of the DC line;
a first sensor for measuring the input and output voltages;
a second sensor for measuring the current flowing through the DC line;
a controller for the power semiconductor switch, the controller configured to:
switch on the DC switch for a first time period;
determine the input voltage present;
determine the output voltage present at the end of the first time period;
determine the current intensity present at the end of the first time period;
determine an inductance and/or capacitance from the determined values; and
compare the determined current intensity with a threshold value and, on the basis of the result of the comparison, determine once again the inductance present using a second time period instead of the first time period, wherein the second time period is longer than the first time period.

2. The DC switch as claimed in claim 1, wherein the control device uses a duration defined prior to switch-on as the first time period.

3. The DC switch as claimed in claim 1, wherein the control device shortens the first time period and to switch off the DC switch if the current intensity reaches a current threshold value.

4. The DC switch as claimed in claim 1, wherein the control device calculates the inductance present in accordance with the formula:

$$L_{supply\,line} = \frac{U \cdot t_{pulse}}{I_{peak}}$$

wherein $L_{supply\,line}$ the inductance, U is a driving voltage determined from input voltage and/or output voltage, $t_{pulse}$ is the first time period, and $I_{peak}$ is the current intensity present at the end of the first time period.

5. The DC switch as claimed in claim 1, wherein the control device determines whether a supply voltage is present.

6. The DC switch as claimed in claim 1, wherein the control device determines the output voltage present at the beginning of the first time period.

7. The DC switch as claimed in claim 1, wherein the control device carries out a determination of the inductance and/or capacitance present before each switch-on process.

8. The DC switch as claimed in claim 1, wherein the control device compares the determined inductance present with a maximum permitted inductance and a minimum permitted inductance and to generate a signal indicating whether the determined inductance lies between the permitted inductances.

9. The DC switch as claimed in claim 1, wherein the control device calculates the capacitance present on the load side in accordance with the formula:

$$C_{load} = \frac{(Q_{load1} + Q_{load2})}{\Delta U_{out}}$$

wherein $C_{load}$ is the capacitance, $Q_{load1}$ is a quantity of charge input on the load side in the connected state, $Q_{load2}$ is a quantity of charge input on the load side after the switching into the disconnected state, and $\Delta U_{out}$ is the change in the output voltage that arises as a result of the input quantities of charge.

10. The DC switch as claimed in claim 9, wherein the control device calculates the input quantities of charge in accordance with the formulae:

$$Q_{load1} = \frac{i_{peak} \cdot (t_{off} - t_0)}{2};$$

and $$Q_{load2} = \frac{i_{peak} \cdot (t_1 - t_{off})}{2}$$

wherein $t_0$ is a switch-on instant, $t_{off}$ is a switch-off instant, and $t_1$ is an instant at which the current intensity reaches zero again after switch-off.

11. The DC switch as claimed in claim 9, wherein the control device determines the input quantities of charge by numerical integration of the current intensity.

12. The DC switch as claimed in claim 1, wherein the control device compares the determined capacitance present on the load side with a maximum permitted capacitance and generates a signal indicating whether the determined capacitance is greater than the maximum permitted capacitance.

13. A DC switch for disconnecting a DC line, the switch comprising:
a power semiconductor switch arranged in a current path of the DC line;
a first sensor for measuring the input and output voltages;
a second sensor for measuring the current flowing through the DC line;
a controller for the power semiconductor switch, the control device configured to:
switch on the DC switch for a first time period;

determine the input voltage present;

determine the output voltage present at the end of the first time period;

determine the current intensity present at the end of the first time period; and determine an inductance and/or capacitance from the determined values, wherein the controller repeatedly carries out the determination of the inductance present and ascertains an averaged inductance.

14. A DC switch for disconnecting a DC line, the switch comprising:

a power semiconductor switch arranged in a current path of the DC line;

a first sensor for measuring the input and output voltages;

a second sensor for measuring the current flowing through the DC line;

a controller for the power semiconductor switch, the control device configured to:

switch on the DC switch for a first time period;

determine the input voltage present;

determine the output voltage present at the end of the first time period;

determine the current intensity present at the end of the first time period; and determine an inductance and/or capacitance from the determined values;

ascertain a duration for the current intensity to fall to zero after the switching into the disconnected state and to take into account when ascertaining the capacitance present on the load side.

* * * * *